(12) United States Patent (10) Patent No.: US 8,744,227 B2
Nakashiba et al. (45) Date of Patent: Jun. 3, 2014

(54) METHOD FOR FORMING MIRROR-REFLECTING FILM IN OPTICAL WIRING BOARD, AND OPTICAL WIRING BOARD

(75) Inventors: Tohru Nakashiba, Osaka (JP); Naoyuki Kondou, Sakai (JP); Shinji Hashimoto, Kadoma (JP)

(73) Assignee: Panasonic Corporation, Osaka (JP)

( * ) Notice: Subject to any disclaimer, the term of this patent is extended or adjusted under 35 U.S.C. 154(b) by 163 days.

(21) Appl. No.: 13/139,086

(22) PCT Filed: Dec. 17, 2009

(86) PCT No.: PCT/JP2009/071507
§ 371 (c)(1),
(2), (4) Date: Jun. 10, 2011

(87) PCT Pub. No.: WO2010/074186
PCT Pub. Date: Jul. 1, 2010

(65) Prior Publication Data
US 2011/0243495 A1 Oct. 6, 2011

(30) Foreign Application Priority Data
Dec. 22, 2008 (JP) ................................. 2008-325933

(51) Int. Cl.
*G02B 6/10* (2006.01)
*G02B 6/12* (2006.01)
*G02B 6/26* (2006.01)
*G02B 6/42* (2006.01)

(52) U.S. Cl.
USPC ................................ 385/132; 385/14; 385/47

(58) Field of Classification Search
USPC .................. 385/132, 14, 18, 47, 129
See application file for complete search history.

(56) References Cited

U.S. PATENT DOCUMENTS

| 5,328,534 A | * | 7/1994 | Calhoun et al. | ................ | 156/150 |
| 5,864,425 A | | 1/1999 | Filas | | |
| 7,202,007 B2 | * | 4/2007 | Shibata et al. | ................ | 430/199 |

(Continued)

FOREIGN PATENT DOCUMENTS

| CN | 1444065 | 9/2003 |
| CN | 1529187 | 9/2004 |

(Continued)

OTHER PUBLICATIONS

Nakashiba et al., "Optical-Electrical Flexible Printed Wiring Board", Matsushita Electric Works Technical Report, vol. 54, No. 3, Sep. 2006, pp. 38-43.

*Primary Examiner* — Ryan Lepisto
*Assistant Examiner* — Robert Tavlykaev
(74) *Attorney, Agent, or Firm* — Greenblum & Bernstein, P.L.C.

(57) ABSTRACT

An aspect of the present invention is directed to a method for forming a mirror-reflecting film on a waveguide in an optical wiring board, characterized in that a multilayer film, in which a base, a metal layer and an adhesive layer are layered in this order, is used, and the metal layer is transferred and bonded to an inclined face for mirror-reflecting film formation provided on the waveguide, with the adhesive layer of the multilayer film intervening. The present invention provides a method which, when forming a mirror-reflecting film on a waveguide in an optical wiring board, enables inexpensive and easy formation of the mirror-reflecting film, using the smallest quantity of metal possible and employing comparatively simple facilities and techniques.

14 Claims, 9 Drawing Sheets

(56) References Cited

U.S. PATENT DOCUMENTS

| | | |
|---|---|---|
| 7,538,358 B2 * | 5/2009 | Badehi et al. ............ 257/98 |
| 2002/0148113 A1 * | 10/2002 | Forrest et al. ............ 29/847 |
| 2003/0169477 A1 | 9/2003 | Togawa et al. |
| 2004/0234224 A1 | 11/2004 | Ishizaki et al. |
| 2005/0074207 A1 | 4/2005 | Shioda et al. |
| 2005/0238278 A1 | 10/2005 | Nakashiba et al. |
| 2006/0177188 A1 * | 8/2006 | Ishizaki et al. ............ 385/132 |
| 2006/0204196 A1 | 9/2006 | Naitou et al. |
| 2007/0140636 A1 | 6/2007 | Tanaka et al. |
| 2007/0189661 A1 | 8/2007 | Nakashiba et al. |
| 2007/0280585 A1 | 12/2007 | Warashina et al. |
| 2008/0107881 A1 | 5/2008 | Nakashiba et al. |
| 2008/0113168 A1 | 5/2008 | Nakashiba et al. |
| 2008/0226228 A1 | 9/2008 | Tamura et al. |

| | | |
|---|---|---|
| 2009/0046978 A1 * | 2/2009 | Yasuda et al. ............ 385/31 |

FOREIGN PATENT DOCUMENTS

| | | |
|---|---|---|
| CN | 1605887 | 4/2005 |
| CN | 1620620 | 5/2005 |
| CN | 1656401 | 8/2005 |
| CN | 1910486 | 2/2007 |
| CN | 101266325 | 9/2008 |
| EP | 1674902 | 6/2006 |
| EP | 1701188 | 9/2006 |
| JP | 50-155243 | 12/1975 |
| JP | 55-93103 | 7/1980 |
| JP | 2007-15159 | 1/2007 |
| JP | 2007-086210 | 4/2007 |
| JP | 2008-304615 | 12/2008 |

* cited by examiner

METHOD FOR FORMING MIRROR-REFLECTING FILM IN OPTICAL WIRING BOARD, AND OPTICAL WIRING BOARD

TECHNICAL FIELD

This invention relates to a method for forming a mirror-reflecting film in an optical wiring board, and to an optical wiring board comprising the mirror-reflecting film formed by this method.

BACKGROUND ART

Optical wiring boards, which are printed boards incorporating optical waveguides, are attracting attention as a means of resolving such persistent problems in various information processing equipment as high-frequency noise accompanying faster signals and inadequate transmission bandwidth.

In such optical wiring boards, mirror-reflecting films are formed on optical waveguides in order to bend light at desired angles, as for example when light is output from or, conversely, input to the board surface. As the method of forming such films, for example a method such as that of Non-patent Document 1 is known. This method comprises a process of forming a mirror-shape inclined face, and a process of forming a reflecting film on this surface. A summary of the method is explained as follows, referring to the figures.

Figure 1:
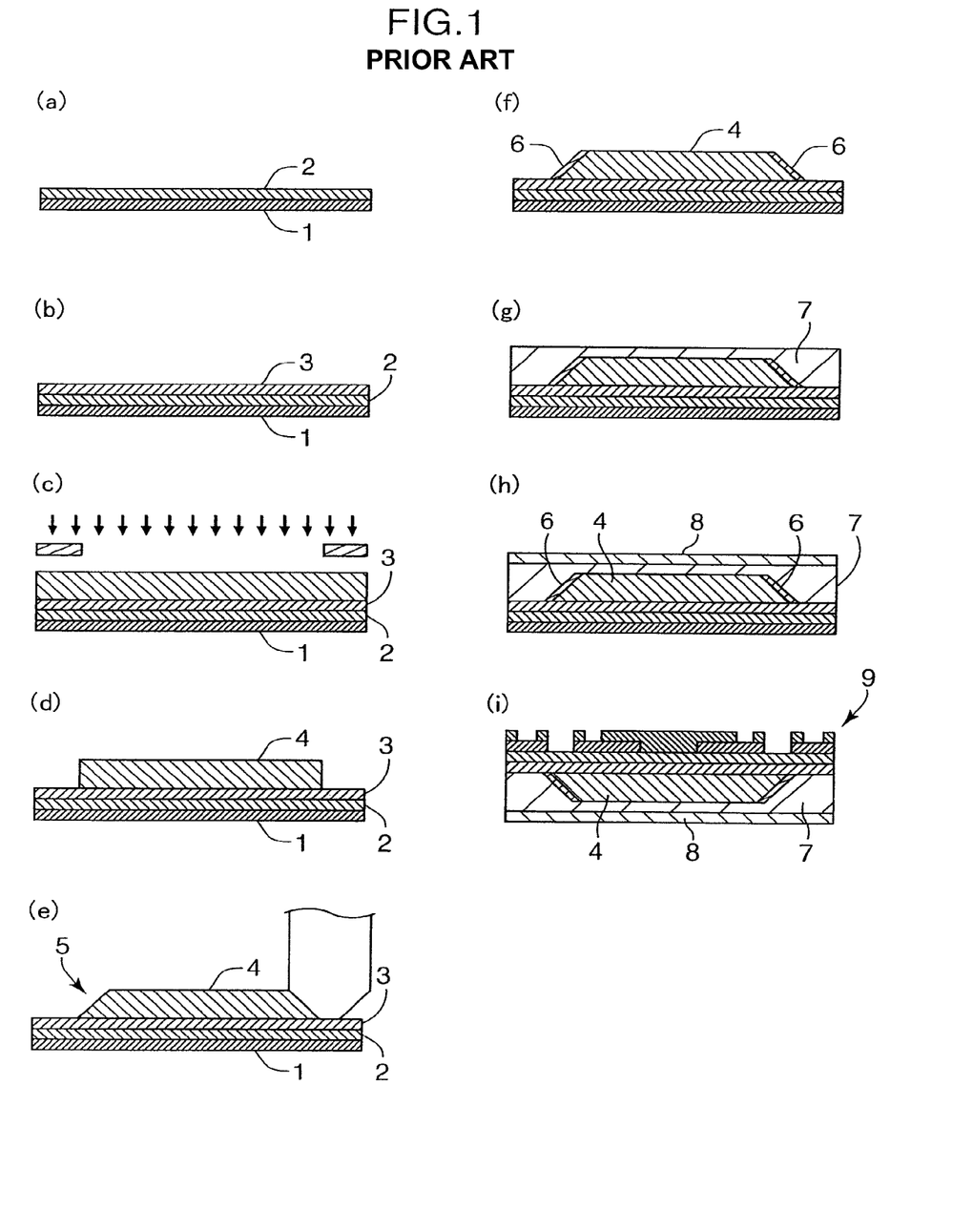
FIG. 1 is a schematic process diagram showing an example of a conventional method of fabricating an optical wiring board in which a mirror-reflecting film is formed on an optical waveguide.

In FIG. 1, (a) through (i) are schematic diagrams for explaining an example of a method of fabricating an optical wiring board, in which a mirror-reflecting film is formed on an optical waveguide, and show a representative method of fabricating a flexible-type optical wiring board.

First, a flexible electric board comprising a metal layer 1 of copper foil or similar and an insulating layer 2 formed from polyimide resin or similar is prepared ((a) of FIG. 1). On the face of the insulating layer 2 is formed a first cladding layer 3 ((b) of FIG. 1).

As the material of the cladding layer 3, resin having the desired transparency at the wavelength of the propagating light, for example 850 nm, is used. Various forms may be used, including liquid, semi-solidified film, or a UV-hardening material or thermosetting material. When a liquid is used, for example a spin coating method is applied, or in the case of a film, for example a vacuum lamination method is applied, and the liquid or the film is deposited on the insulating layer 2 and is hardened as necessary.

Next, a core layer 4 is formed ((c) and (d) of FIG. 1). The core layer 4 is a portion which confines light and enables propagation of light through total reflection at the interface with the cladding layer 3, and is normally patterned to a width of order several μm to several hundred μm.

As the constituent material of the core layer 4, a resin having a higher refractive index than the cladding layer 3, and having the desired transparency at the wavelength of the propagating light, for example 850 nm, is used. The form may be liquid or a semi-solidified film, and in general, a material which has UV hardening properties and can be patterned by UV lithography is employed.

The core layer 4 is generally formed by steps in which, after the entire surface is covered with film similarly to the cladding layer 3, masking is performed to mask unnecessary portions, and UV irradiation is then performed to harden only the necessary portions ((c) of FIG. 1), followed by a step in which the unnecessary portions are washed away (development) ((d) of FIG. 1).

Next, an inclined face 5 for mirror film formation is formed ((e) of FIG. 1). As the technique, for example a method employing a dicing blade, a method employing a router blade, or a method employing a laser may be used, in which normally the inclined face 5 is formed at an angle of approximately 45°. In the step immediately after formation of the inclined face 5, it may occur that the surface smoothness is insufficient for use as a mirror; in such cases, a varnish obtained by diluting the waveguide material may be applied to the machined face to improve the smoothness.

Next, the mirror-reflecting film 6 is formed on the inclined face 5 ((f) of FIG. 1). In forming the mirror-reflecting film 6, normally a vacuum process such as vacuum evaporation or sputtering is adopted. As the material of the mirror-reflecting film 6, of course a material with superior reflectivity in the wavelength region of the light to be transmitted is selected, but in consideration of reliability and cost, a material with a balance of properties is selected. For example, in Non-patent Document 1, Au (gold) is used.

Next, the core layer 4 in which the mirror-reflecting film 6 has been formed on the inclined face 5 is covered with a second cladding layer 7 ((g) of FIG. 1). In forming the second cladding layer 7, in general, the same material as in the first cladding layer 3 is adopted. The technique is also similar; in the case of a liquid, for example a spin-coating method is used, and in the case of a film form, for example a vacuum lamination method can be used for the formation (film deposition), followed by hardening performed as necessary.

After forming the second cladding layer 7, a coverlay layer 8 is formed thereupon to protect the light transmission layer ((h) of FIG. 1). As the material of the coverlay layer 8, a polyimide resin, polyester resin, or similar is used, and is applied by a vacuum press method or lamination method, followed by heating at approximately 140 to 170° C. to harden an adhesive layer.

Finally, processes such as formation of through-holes, circuit patterning, and solder resist, as well as metal plating are performed to complete the surface layer circuit 9 ((i) of FIG. 1). At this time, micrometer-order positioning precision may be required for the pads for mounting optical elements, and in such cases, a method of high-precision pad formation using laser machining is adopted, as for example described in Patent Document 1.

Patent Document 1: Japanese Patent Application Laid-open No. 2007-086210

Non-patent Document 1: Matsushita Electric Works Technical Report, Vol. 54, No. 3, "Optical/Electric Composite Flexible Print Board" (issued September 2006)

SUMMARY OF THE INVENTION

In the conventional methods of fabrication of optical wiring boards such as that shown in FIG. 1, as the method of forming mirror-reflecting films 6 on optical waveguides, vacuum evaporation methods or sputtering methods as described above have been adopted to cause a metal to adhere to an inclined face 5. However, according to an investigation by the inventors, vacuum processing equipment or other large-scale equipment is necessary in order to perform such methods, so that excessive economic burdens are imposed.

Moreover, according to the investigation by the inventors, metal cannot be propelled only onto limited necessary areas in these methods, so that adhesion of the metal is to be performed in a state covering regions other than the regions for adhesion by masking, thus making the adhesion task difficult. In addition, the metal evaporation source (sputtering source) is used in greater than the needed amount, so that there is the problem that material costs are increased.

In view of the above problems residing in the conventional methods, an object of the present invention is to provide a method enabling easy and inexpensive formation of a mirror-reflecting film, using the smallest quantity of metal possible and employing comparatively simple facilities and techniques, when forming mirror-reflecting films on waveguides in optical wiring boards.

An aspect of the present invention is directed to a method of forming a mirror-reflecting film on a waveguide in an optical wiring board, the method being characterized in that a multilayer film, in which a base, a metal layer and an adhesive layer are layered in this order, is used, and in that the metal layer is transferred and bonded to an inclined face for mirror-reflecting film formation provided on the waveguide, with the adhesive layer of the multilayer film intervening.

Another aspect of the present invention pertains to an optical wiring board comprising the mirror-reflecting film fabricated by the method described above.

The objects, features, aspects and advantages of the present invention will become more apparent from the detailed description below along with the accompanying drawings.

DESCRIPTION OF EMBODIMENTS

Below, embodiments of the invention and advantageous effects of the invention are explained in greater detail, referring to the drawings.

A characteristic of the present invention is that, in a well-known process of fabricating an optical wiring board such as for example that shown in FIG. 1 above, an innovation has been made in the method of formation of the mirror-reflecting film in particular. Specifically, as explained in detail below, the invention is characterized in that a multilayer film in which a base, a metal layer and an adhesive layer are layered in this order is used; the multilayer film is set such that the adhesive layer is in contact with an inclined face for a mirror which is formed on the waveguide in the optical wiring board; and thereafter the base alone is peeled to cause transfer and bonding of the metal layer to the inclined face for the mirror.

Figure 2:
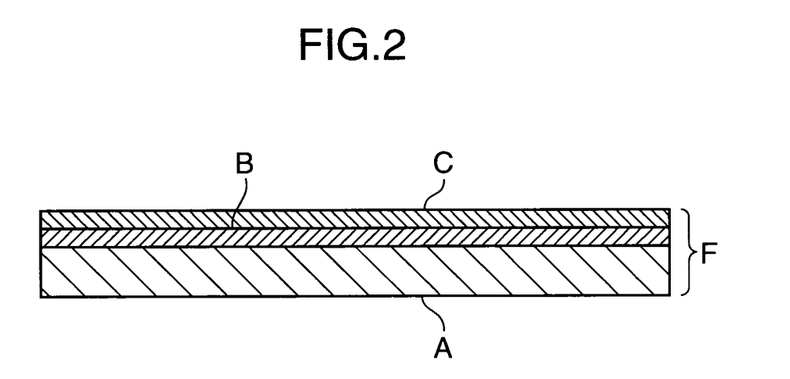
FIG. 2 is a cross-sectional diagram showing an example of the configuration of the multilayer film for transfer in an embodiment of the invention.

FIG. 2 shows the configuration of the multilayer film for transfer, in which fundamentally a three-layer structure comprising a base A, metal layer B, and adhesive layer C is employed.

No limitations in particular are imposed on the material of the base A, and a polyester resin such as polyethylene terephthalate (PET), an acrylic resin, a polyimide resin, and the like can be used. It is preferable that the material be easily peelable from the metal layer B with which the base is layered, and ordinary plastic film is generally appropriate.

When the adhesive layer C which is used is a material requiring heating for transfer, such as for example a thermosetting resin or a hot-melt resin, the base A can be selected from materials with thermal resistance, having the ability to withstand the heat used in transfer. No limitations in particular are imposed on the thickness of the base A, but it is preferable that the layer be thin in order to secure the flexibility to enable the base to follow the inclined face for mirror formation, and a thickness of 0.2 mm or less is recommended. The thickness of the base A is preferably in, but not limited to, a range of 0.01 to 0.05 mm.

No limitations in particular are imposed on the type of the metal layer B either, but it is preferable to use a metal having high reflectivity for the light to be transmitted. For example, 850 nm is a representative wavelength of VCSELs, which are light-emitting elements suitable for surface mounting. Metals with a high reflectivity at this wavelength are, for example, copper, silver, gold, aluminum, nickel, chromium, and similar. When the stability of the material is considered, copper, silver and gold are particularly preferable, and gold in particular is optimal. However, of course another metal can be selected, taking into consideration the environment of use including temperature and humidity, or required characteristics.

The thickness of the metal layer B need only be such that transmitted light does not penetrate, and a target thickness of approximately 0.1 μm or greater is sufficient. The thickness of the metal layer B is preferably in, but not limited to, a range of 0.1 to 0.5 μm.

The adhesive layer C is a layer which is indispensable for transferring the metal layer B onto the inclined face for mirror formation, and any material which hardens can be used. Hardening types of materials include UV hardening types and thermosetting types; specifically, epoxy resins, acrylic resins, polyester resins, and the like are preferable examples. In order to obtain excellent close adhesion with the constituent material of the waveguide, it is preferable that a material of the same kind as the waveguide constituent material be used.

When a UV hardening type is used, it is desirable from the standpoint of process machining properties that hardening occurs at an irradiation amount of approximately 4000 mJ or less. In the case of a thermosetting type, materials which harden at 60° C. to 150° C. are easy to handle, and so are preferred.

The thickness of the adhesive layer C may be approximately 1 μm or greater. It is noted that when the inclined face for mirror formation is formed using dicing or other normal machining, cutting bands may appear in the machined face, and so the thickness of the adhesive layer C is preferably thicker than the maximum difference of height between the top and bottom surface of such cutting bands or other roughness. This is because cutting bands and similar can be reliably filled in, so that a smooth reflecting face can be obtained. By this means, pretreatment of smoothing the face for reflecting film formation is made unnecessary, and optical scattering losses of the mirror-reflecting film can be suppressed. The thickness of the adhesive layer C is preferably in, but not limited to, a range of 1 to 3 µm.

It is desirable that the refractive index of the adhesive layer C be substantially the same as that of the core layer. The reason is explained as follows. When the metal layer B is transferred onto the inclined face for mirror formation, light must penetrate the adhesive layer C in order for the light to enter and leave the waveguide. If there is mismatching of refractive indexes, light reflection losses occur according to the magnitude of the mismatch. However, by making the refractive index substantially the same for the core layer and for the adhesive layer C, such light reflection losses can be prevented.

Similarly, it is desirable that the adhesive layer C be transparent in the wavelength range of light being transmitted. This is because, as explained above, since the light passes through the adhesive layer C when reflecting light, the absorption losses occur if the adhesive layer C is not transparent.

No limitations in particular are imposed on the method of manufacture of the multilayer film F as well. For example, the method shown in the process diagram of FIG. 3 may be used. That is, the base A such as a PET film is prepared ((a) of FIG. 3), and vacuum evaporation, sputtering, or another arbitrary method is used to form the metal layer B having the desired thickness on the surface of the base A ((b) of FIG. 3). Then, on the surface of the metal layer B, a varnish containing the material to become the adhesive layer C is formed to the desired thickness by painting, spin-coating, dipping, or another arbitrary method ((c) of FIG. 3), and if necessary is dried ((d) of FIG. 3).

Next, a method of transferring the metal layer B of the multilayer film F onto the inclined face for mirror formation is explained. This invention is characterized by a method of forming a metal layer on an inclined face for mirror formation. Processes up to formation of an inclined face for mirror-reflecting film formation on a waveguide in an optical wiring board, and processes from formation of a second cladding layer after reflecting film formation up to surface circuit formation, can be performed similarly to (a) to (e) of FIG. 1 and (g) to (i) of FIG. 1 in the technology of the prior art explained in FIG. 1 above. Hence an explanation of these processes is omitted, and the explanation is focused on the processes for forming the metal layer B.

Figure 4:
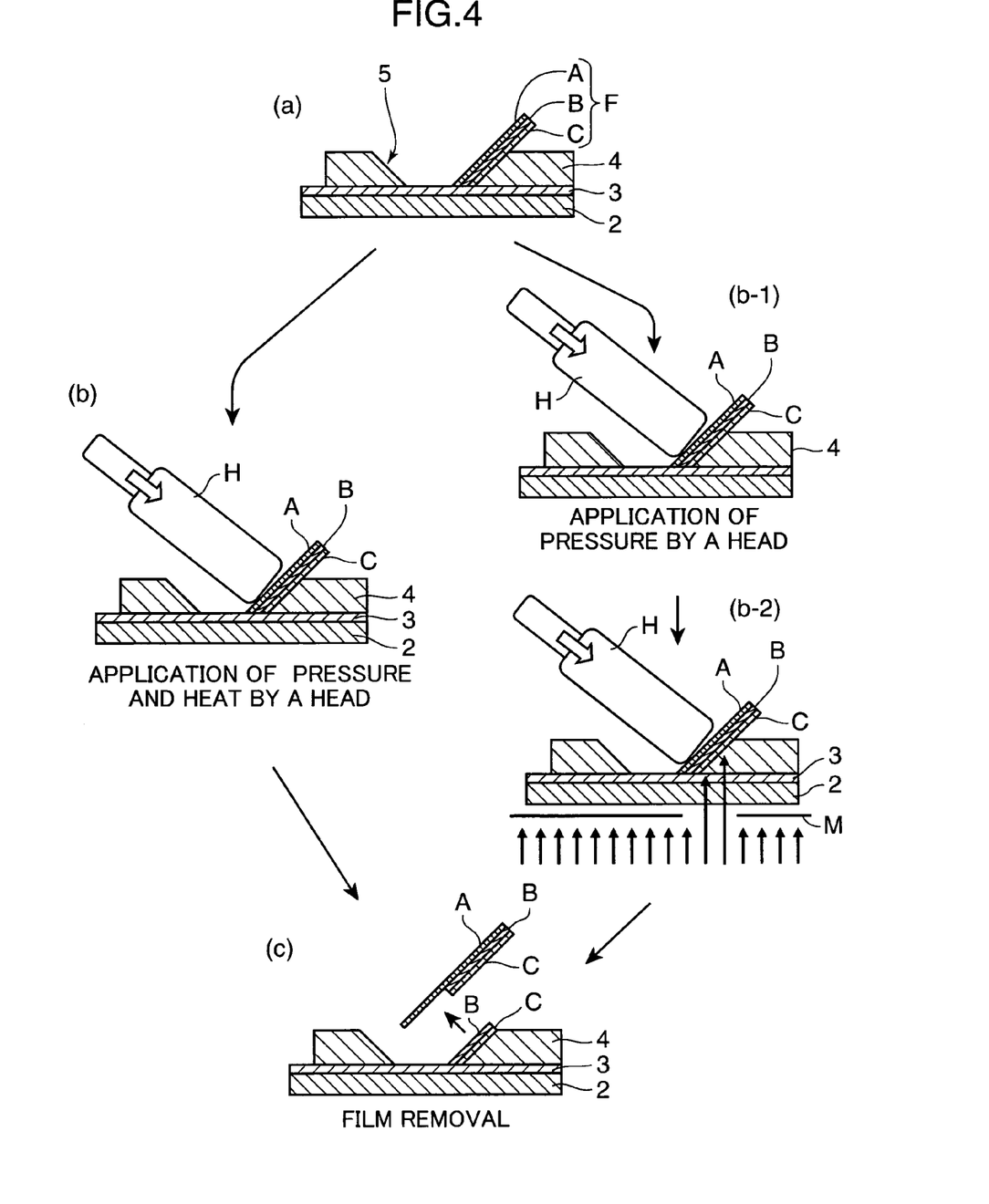
FIG. 4 is a conceptual diagram showing an example of the method when hardening the adhesive layer during transfer.

FIG. 4 is a conceptual diagram showing an example of the method when hardening the adhesive layer during transfer, in which both a case of thermosetting and a case of UV hardening are indicated. In the case of UV hardening, only a method of using a mask to limit the irradiated region is shown.

As shown in (a) of FIG. 4, while confirming the position using a microscope or other means, the multilayer film F comprising the base A, metal layer B, and adhesive layer C is set on the surface of the inclined face 5 for mirror formation, to which transfer is to be performed. Then, as shown in (b), (b-1), and (b-2) of FIG. 4, a head (or heating head) H, preferably with a tip portion comprising elastic material, is brought close to the side of the base A of the multilayer film F, and the multilayer film F is pressed against the inclined face 5. The pressing force at this time, although it depends on the material characteristics of the adhesive layer C, is preferably in the range of 0.05 M to 0.2 MPa from the standpoint of process attributes.

When hardening the adhesive layer C, it is preferable that the adhesive layer C is hardened while the multilayer film F is fixed with the head H, from the viewpoint of stability. When the adhesive layer C has already adhesive properties, or exhibits adhesive properties upon heating, the adhesive layer C can be hardened in a state that the head H is removed.

When the adhesive layer C is a thermosetting type layer, as shown in (b) of FIG. 4, the heating head H is pressed from the side of the base A against the inclined face 5, and heat and pressure are applied. In this case, because it is necessary to convey heat from the heating head H through the base A and metal layer B to the adhesive layer C, the heating temperature is preferably set to the temperature of 1 to 20% higher than the thermosetting temperature. This is because a considerable amount of heat is dispersed from the metal layer B.

When the adhesive layer C is a UV-hardening layer, upon pressing the head H against the inclined face 5 from the side of the base A as shown in (b-1) of FIG. 4, the adhesive layer C is irradiated with UV from the rear-face side as shown in (b-2) of FIG. 4 and is hardened. This is because, if UV is irradiated from the upper face, the UV is blocked by the metal layer B, and UV does not reach the adhesive layer C.

M represents a mask, which blocks regions other than regions in which UV irradiation is necessary, so that areas not requiring UV irradiation are not irradiated. When a layer which does not pass UV exists on the rear-face side, such method of irradiating from the rear-face side cannot be adopted.

When performing UV irradiation so that only transfer target portions are irradiated with UV, in addition to the method of using the mask M to block regions other than regions for irradiation as shown in the example above, for example a method of concentrating light using a lens or the like, or a method of using laser light with good directionality, or similar can be adopted.

Finally, the multilayer film F is peeled and removed, as shown in (c) of FIG. 4. At this time, in portions in which the adhesive layer C is hardened, the metal layer B is transferred to the side of the inclined face 5 via the adhesive layer C, and portions not hardened are peeled and removed together with the base A.

Figure 5:
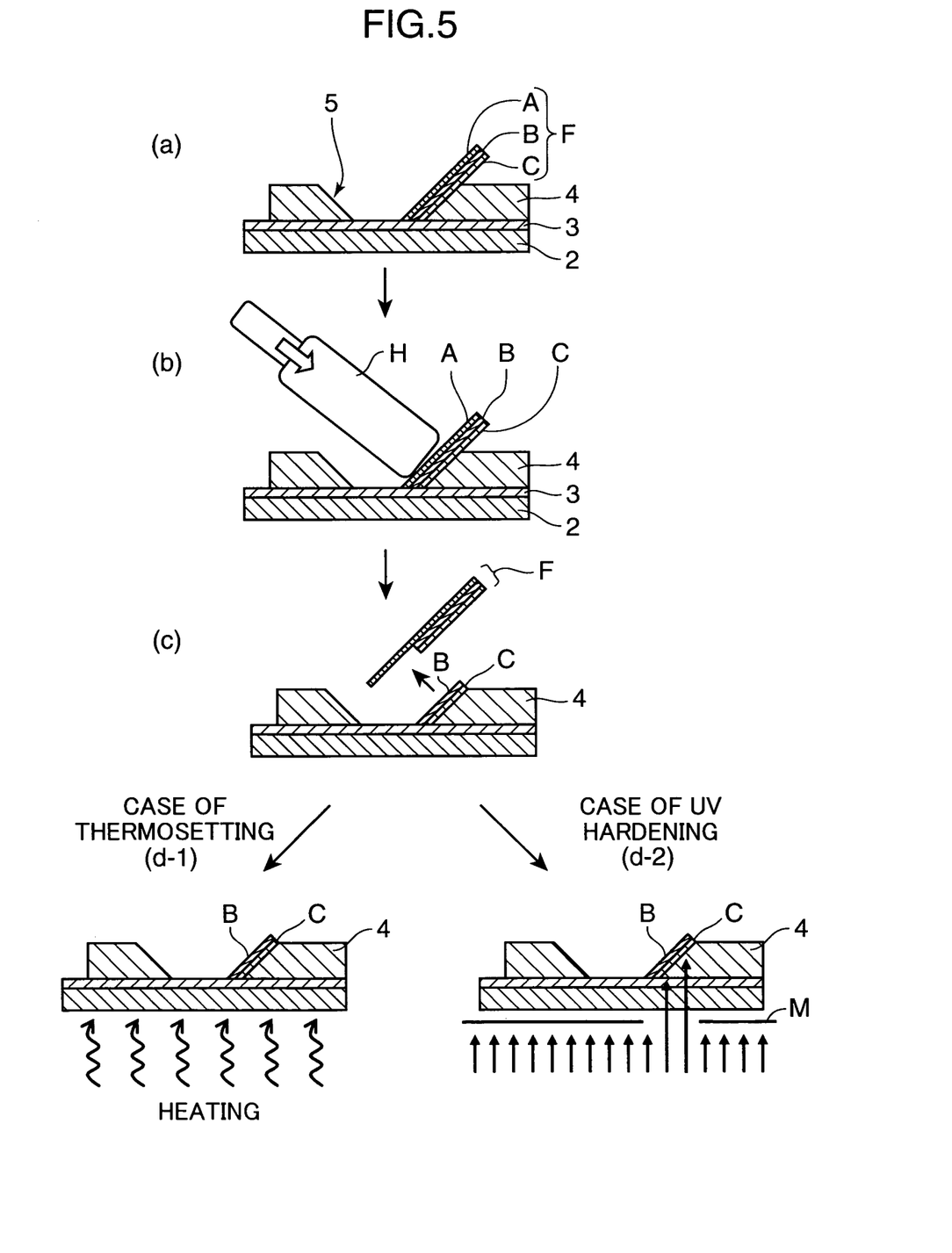
FIG. 5 is a conceptual diagram showing an example of the method when hardening the adhesive layer after transfer.

Next, FIG. 5 is a conceptual diagram showing an example of the method when the adhesive layer C is hardened after transfer. As an example of thermosetting, only a method of heating the entire board is shown, and as an example of UV hardening, a method of hardening without pressing the head H from above the metal layer B is shown.

When the adhesive layer C comprises a material which has adhesive properties, or which exhibits adhesive properties upon heating, the adhesive layer C can be hardened after the metal layer B has been transferred onto the inclined face 5. That is, while depending on the types and combinations of materials, in the state in which the adhesive layer C has not yet hardened, if the adhesive force between the inclined face and the adhesive layer exceeds the adhesive force between the metal layer and the base film, then the metal layer B can be transferred to the inclined face 5 by peeling away the base A even when the adhesive layer C is not hardened.

In the method shown in FIG. 5, similarly to the explanation using FIG. 4 above, the multilayer film F comprising the base A, metal layer B, and adhesive layer C is set on the surface of the inclined face 5 for mirror formation, to which transfer is to be performed ((a) of FIG. 5). At this time, the adhesive layer C is held so as to face the inclined face 5. Then, the head H, the tip portion of which preferably comprises an elastic material, is brought close to the side of the base A of the multilayer film F, and the multilayer film F is pressed against the inclined face 5 ((b) of FIG. 5), and then the multilayer film F is peeled and removed to cause transfer of the metal layer B onto the inclined face 5 ((c) of FIG. 5), and finally the adhesive layer C is subjected to thermosetting ((d-1) of FIG. 5) or to UV hardening ((d-2) of FIG. 5).

When, while causing thermosetting, heating is performed through the metal layer B from the heating head H, the temperature of the heating head H is preferably set to the temperature of 1 to 20% higher than the temperature to which heating is required in order to compensate for dispersion of heat from the metal layer B, similarly to the case of FIG. 4. However, when heating the entire board, this is not necessary. The timing for thermosetting may be immediately after the transfer, or may be after formation of the second cladding layer.

When inducing UV hardening also, there are in essence no differences from the example shown in FIG. 4 above, and UV hardening may be performed similarly. The timing of UV hardening may also be either immediately after transfer, or in an arbitrary stage after formation of the second cladding. However, when UV transmissivity from the rear face is lost due to coverlay formation or for some other reasons, UV hardening is to be performed in advance. When inducing UV hardening immediately after transfer, it is useful to perform UV irradiation while again pressing the head against the transferred metal face B, in view of securing stability of the transferred face.

As explained above, when executing methods such as those shown in FIG. 4 and FIG. 5, it is not necessarily required that the adhesive layer C is hardened at the time the metal layer B is transferred onto the inclined face 5, but it is possible to harden by UV treatment, heat treatment, or other means after transfer.

However, if the adhesive layer C is in the unhardened state, the metal layer B is pulled toward the side of the base A when the base A is peeled, and as a result the flatness of the final mirror face is worsened, possibly resulting in light scattering losses. Hence in order to avoid such a possibility and obtain stable reflectivity, it is desirable that the base A be peeled away after the adhesive layer C has been hardened and the metal layer B be transferred onto the inclined face 5.

As already stated, although examples of the preferred adhesive layers include thermosetting layers and UV hardening layers, thermosetting materials are more preferred as those for the adhesive layer in the present embodiment. When causing hardening of the adhesive layer, it is ideal that only the adhesive layer in contact with the inclined face is hardened. In order for example to achieve it with the UV hardening adhesive layer, either the light is to be condensed in spots, or the mask is to be used to limit the irradiated area. Also, if irradiation with light is performed from the base side, the metal layer is in the way and the UV does not penetrate, so that irradiation must be performed from the rear side. Thus, the methods of hardening tend to become complex. However, if the thermosetting materials are used for the adhesive layer, heating only in portions can be performed comparatively easily by using the heating head such as a soldering iron for example.

As the device for effecting transfer of the metal layer B of the multilayer film F onto the inclined face for mirror-reflecting film formation, no limitations in particular are imposed, and any device may be used which presses the adhesive layer side of the multilayer film against the inclined face for mirror formation and, by applying pressure and/or heat from the base side of the multilayer film, causes transfer and bonding of the metal layer to the inclined face. Among such devices, a device comprising the heating head H, a camera to recognize mirror formation positions, and a stage capable of moving with submicron precision, is preferred.

For example, as shown in (b) of FIG. 4, when the adhesive layer C is a thermosetting type layer, the device is preferable which comprises the heating head H capable of pressing against the inclined face 5 from the side of the base A of the multilayer film F and applying heat and pressure. Or, as shown in (b-1) and (b-2) of FIG. 4, when the adhesive layer C is a UV hardening layer, the device is preferable which comprises the head H capable of pressing closely against the inclined face 5 from the side of the base A of the multilayer film F.

Examples of the simple device comprising the heating head H include a temperature-controlled type solder iron, the tip temperature of which can be adjusted so as to be from 1 to 20% higher than the thermosetting temperature of the adhesive layer C. And, as explained below, when a solder iron is used having an elastic member mounted on the tip portion of the iron, temperature adjustment can be performed such that a temperature of the surface of the elastic member is at the prescribed temperature by additionally setting a thermocouple in place.

In order to press the multilayer film F against the inclined face 5 using the head H (or heating head H) while fixed in place and cause hardening of the adhesive layer C, it is preferable that the head H (or heating head H) has a pressing force of from 0.05 MPa to 0.2 MPa.

Further, it is desirable that the head in the device used for pressing a multilayer film against an inclined face for mirror formation and causing transfer of the metal layer has an elastic tip. The reason for this is as follows.

That is, the material for the waveguide comprising the inclined face for mirror formation is generally inelastic, and moreover the inclined face is of course inclined relative to the board face. Hence, if the head tip is in a flat shape with no elasticity, it is necessary to make fine adjustments to the head orientation in order to apply pressure and heat to the inclined face uniformly. If the tip face of the head is not parallel to the inclined face upon making contact, pressure and heat are conveyed unevenly, and as a result the mirror performance is worsened.

While depending on the machining method, the inclined face itself is not necessarily flat and may have a degree of undulation or similar, and the extent of undulations or similar is also often not constant. It is therefore not practical to prepare a head with a tip shape which accommodates the various undulations or similar.

Figure 6:
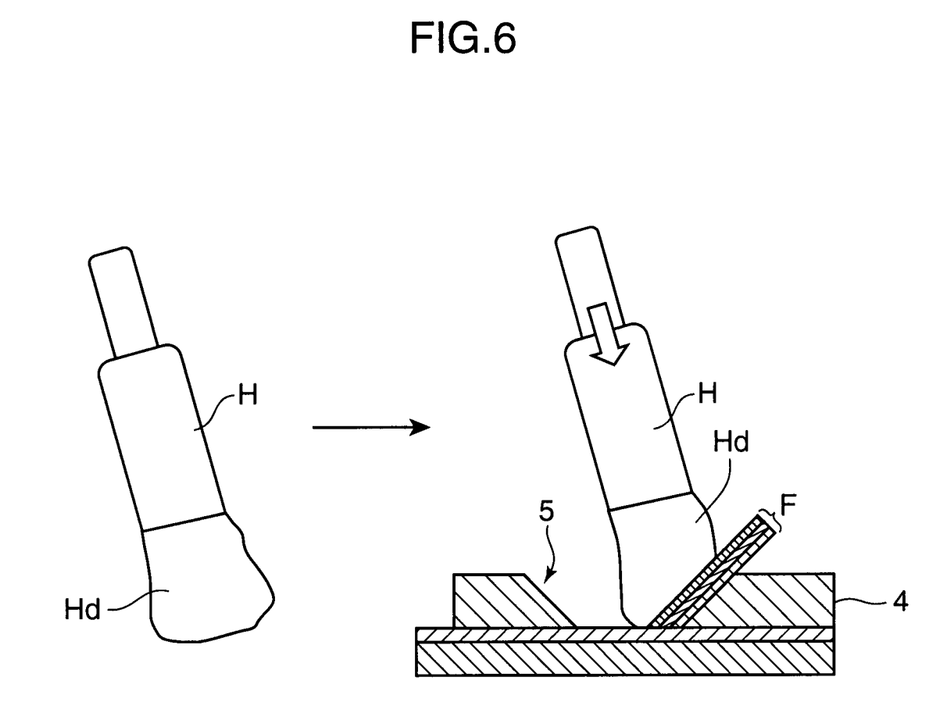
FIG. 6 is a conceptual diagram showing an example of the transfer method using a head with an elastic tip.

Further, if the head with an elastic tip is used, as for example shown in FIG. 6 (in which H represents the head and Hd indicates the elastic member), the tip can flexibly follow the undulations or similar of the inclined face 5, and pressure and heat can be applied uniformly and with stability, thus such head being preferable.

Examples of such elastic materials include, but are not limited to, silicone rubber, nitrile rubber, fluoride rubber, and the like. When the materials are used for a heating head, an elastic material having adequate thermal resistance according to the temperature may be selected.

As the metal layer, it is desirable that a metal layer having high reflectivity at 850 nm be used. This is because the mirror can be optimized at 850 nm, which is the wavelength of the VCSELs (Vertical-Cavity Surface-Emitting Lasers) which are generally used as light sources of optical wiring boards.

Further, in the multilayer film used in the embodiment, it is preferable that the metal layer be divided into a prescribed shape, which is also one preferred embodiment when implementing the invention.

That is, when transferring the metal layer to the inclined face with the adhesive layer intervening, the metal layer is caused to be separated from the base film. At this time, the unhardened adhesive layer in other portions than those for transfer and the metal layer which is layered thereupon are required to be simultaneously cut, peeled and removed. Although the metal layer can be cut comparatively easily since it is extremely thin, in order to enable still easier cutting, it is preferable that the metal layer be divided into the prescribed shape in advance.

Figure 7:
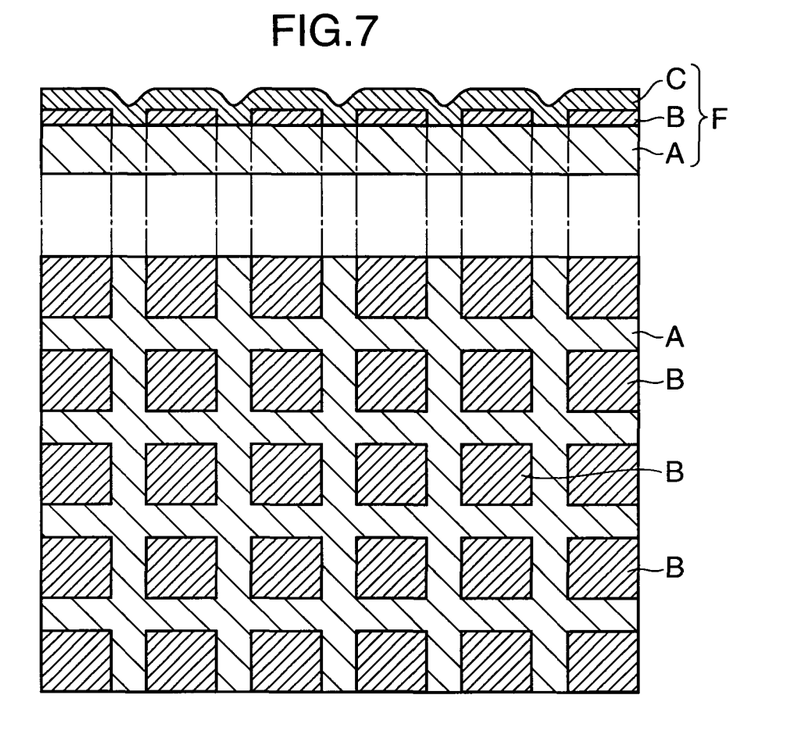
FIG. 7 is a diagram showing an example of the preferred multilayer film for transfer.

FIG. 7 is a diagram showing an example of such a preferred multilayer film F for transfer. Here, the prescribed shape is a shape which adequately covers the entire inclined face for mirror formation to which transfer is to be performed. For example, a shape which is substantially the same as or slightly larger than the shape of the inclined face, is preferred. In the example of FIG. 7, metal layers B with substantially square shapes are provided on the base A, at equal intervals vertically and horizontally, and the adhesive layer C for transfer is formed on the surface side thereof.

Figure 8:
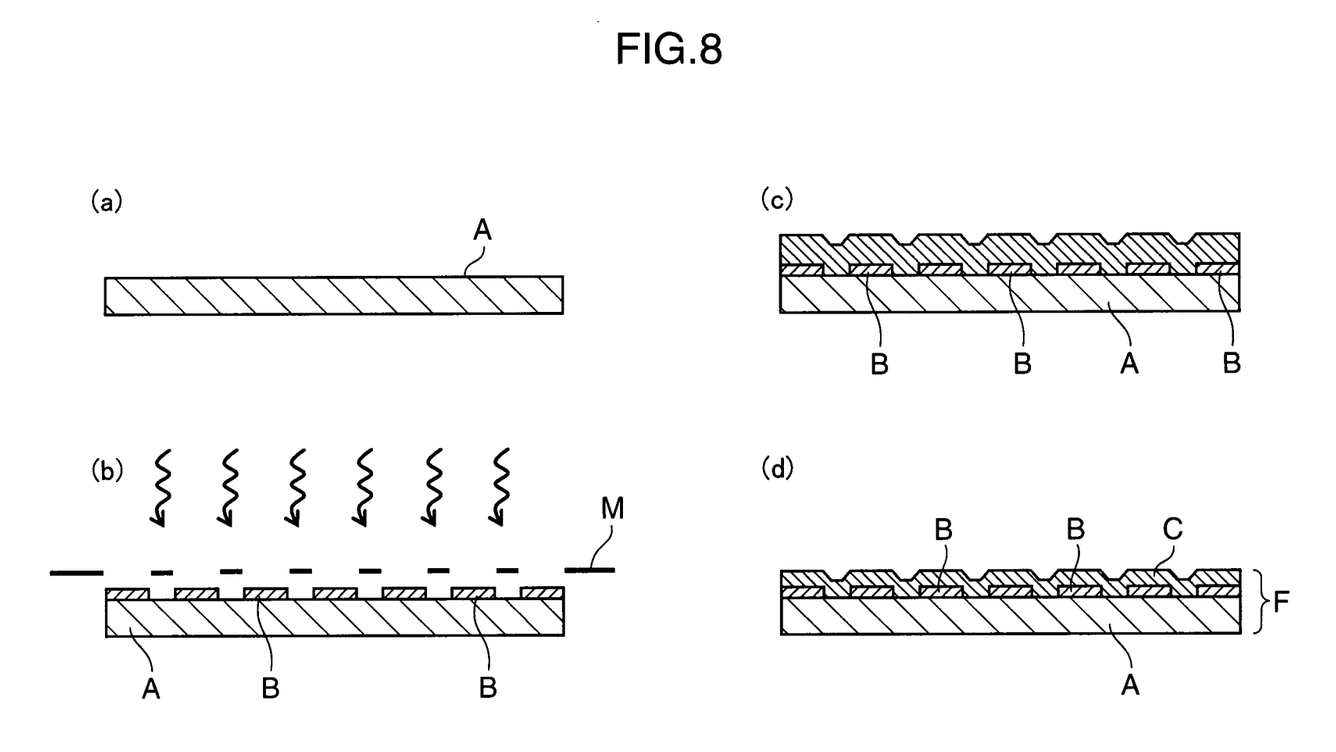
FIG. 8 is a diagram showing an example of the method of fabricating the preferred multilayer film in which the metal layer is divided.

In FIG. 8, (a) through (d) are diagrams showing in an unlimited manner an example of a method of fabricating the preferred multilayer film as shown in FIG. 7. The base A such as a PET film is prepared ((a) of FIG. 8), and the metal layer B with the desired thickness is formed on the surface thereof in the desired shape and position by evaporation deposition, sputtering, or similar ((b) of FIG. 8). At this time, a method is employed in which the shape and positions of the metal layer B are regulated by using the mask M, so that the metal layer B is not formed in areas which are to be divided.

Figure 3:
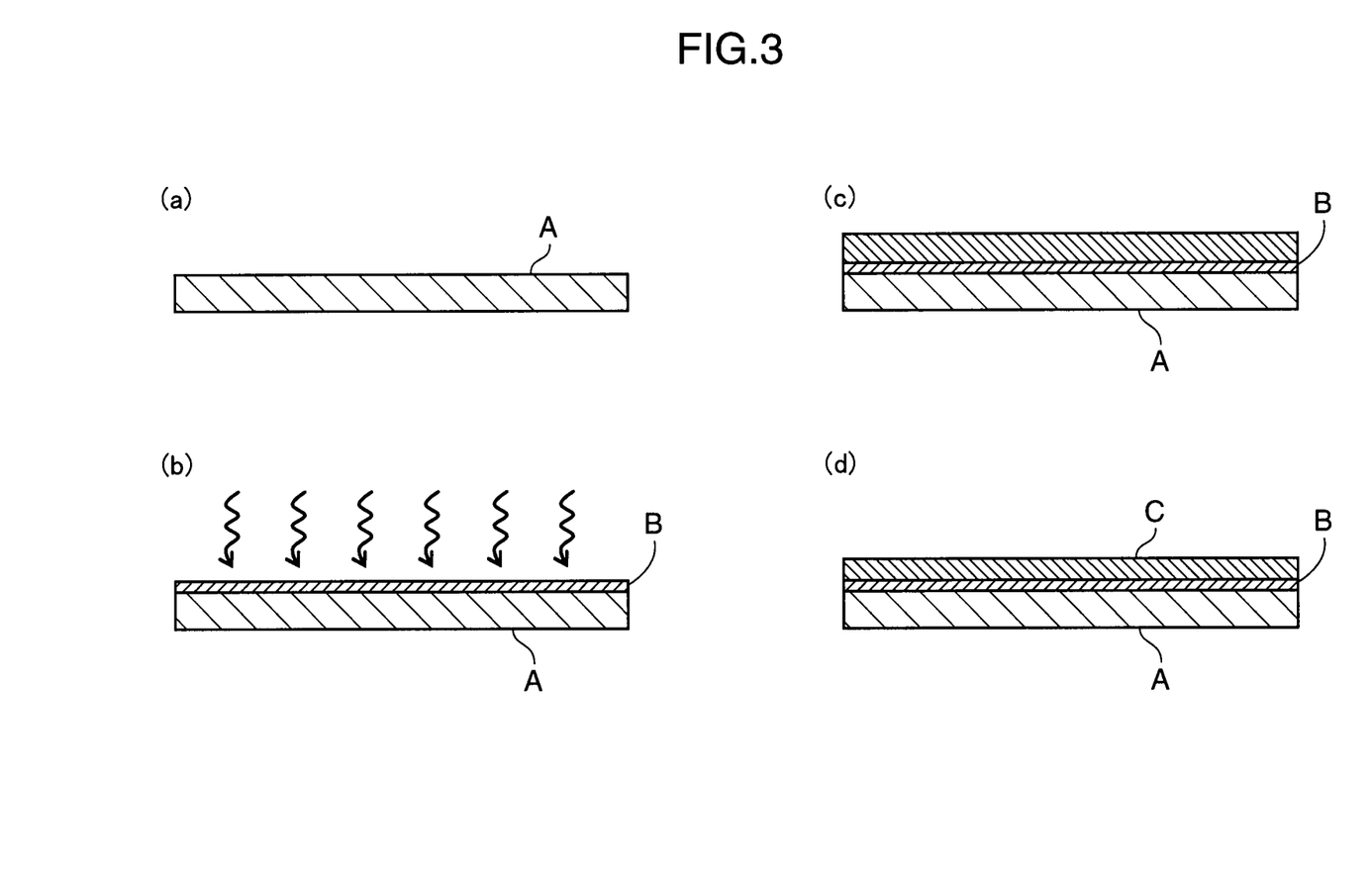
FIG. 3 is a schematic process diagram showing an example of the method of fabricating the multilayer film in an embodiment of the invention.

Then, similarly to the method shown in FIG. 3 above, a varnish for formation of the adhesive layer C is applied onto the metal layer B ((c) of FIG. 8), and then the varnish is dried to obtain a multilayer film F for reflecting film formation ((d) of FIG. 8).

The example shown in FIG. 8 is not such as to limit the invention, and the shape, positioning, and the like of the metal layer B can be modified arbitrarily according to the structure and other characteristics of the surface layer circuit of the optical wiring board.

As the constituent material of the adhesive layer C, a material with high transmissivity for light at 850 nm is preferably used, which is one preferred embodiment for implementing the invention. The reason for this is that, as explained above, the wavelength of VCSELs which are generally used as light sources in optical wiring boards is 850 nm, and the mirror can be optimized in this wavelength region.

Figure 9:
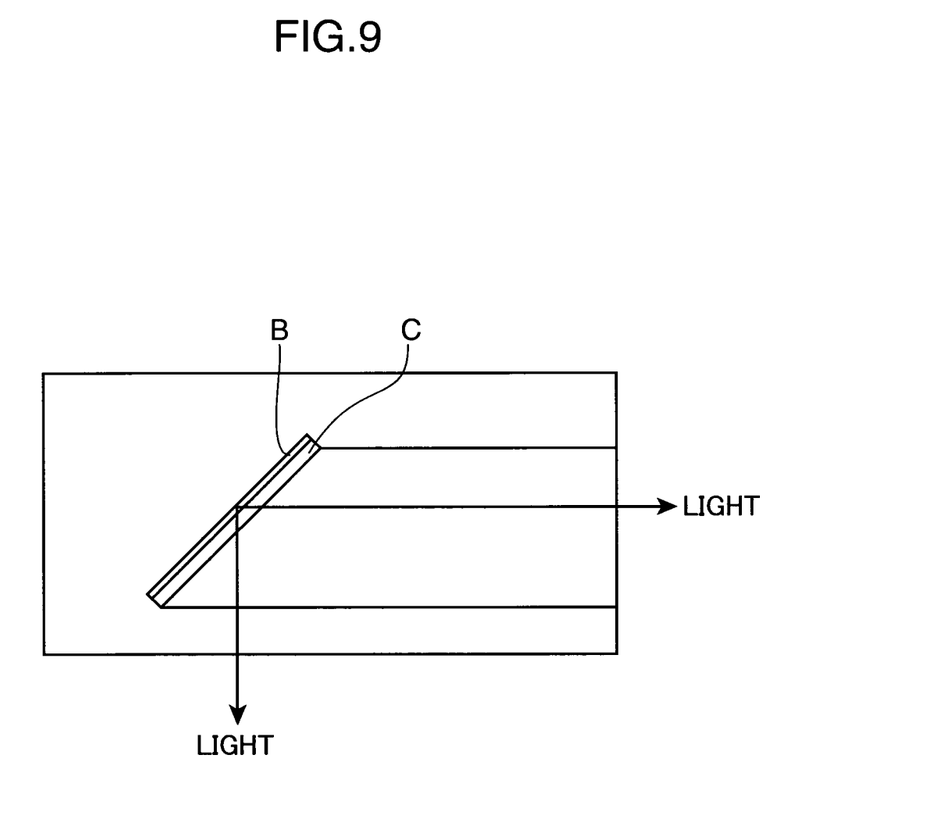
FIG. 9 is a diagram showing a manner in which light passes through the adhesive layer during mirror reflection.

When the metal layer B formed by transfer reflects light as a mirror, the light passes through the adhesive layer C as shown in FIG. 9 (the diagram showing the manner in which light passes through the adhesive layer during mirror reflection). Thus, if the optical transmissivity of the adhesive layer C is heightened, reflected light losses can be suppressed. Here, a "high" transmissivity for light is defined so that a loss in transmission is preferably 0.5 dB or less.

For the similar sense, it is desirable that a material with substantially the same refractive index as the core layer of the waveguide is used as the constituent material of the adhesive layer C. This is because, when the metal layer B reflects light as a mirror, the light passes through the adhesive layer C as shown in FIG. 9, and so reflection losses at the contact interface can be suppressed. Here, the refractive index indicates the refractive index at the wavelength of the propagating light, and "substantially the same" means that a difference in the refractive indexes is within approximately 1%.

As described above, the explanation has focused on the main constitution of the invention which is the method of forming the metal layer on the inclined face for mirror formation. However, the above explanation is provided only to illustrate the present invention by embodiments in all aspects, and thus the present invention is not limited thereto. It is to be understood that numerous modifications not exemplified here are also possible without departing from the scope of the present invention.

The optical wiring board comprising the mirror-reflecting film obtained by adopting the methods of the present invention can be manufactured at a lower cost compared with conventional optical wiring boards due to the advantages of the manufacturing method, and can moreover afford superior performance as well. Hence the optical wiring board having the mirror-reflecting film manufactured by this method is also included within the technical scope of the invention.

EXAMPLES

Below, the invention is explained in greater detail referring to examples. However, the invention is not limited by the following examples, and appropriate modifications can be made within the scope of the embodiments as described above and below. These modifications are also included in the technical scope of the invention.

(Preparation of Epoxy Film for Optical Waveguide)

First, the following three types of film were prepared as materials for the optical waveguide.

1) Epoxy Film A

A blend of 7 parts by weight of a polypropylene glycol glycidyl ether (product name "PG207" manufactured by Tohto Kasei Co., Ltd.), 25 parts by weight of a liquid-form hydrogenated bis-phenol A type epoxy resin (product name "YX8000" manufactured by Japan Epoxy Resin Co., Ltd.), 20 parts by weight of a solid hydrogenated bis-phenol A type epoxy resin (product name "YL7170" manufactured by Japan Epoxy Resin Co., Ltd.), 8 parts by weight of 1,2-epoxy-4-(2-oxiranyl)cyclohexane additive of 2-2-bis(hydroxy methyl)-1-butanol (product name "EHPE3150", manufactured by Daicel Chemical Industries, Ltd.), 2 parts by weight of a solid bis-phenol A epoxy resin (product name "Epicoat 1006FS", manufactured by Japan Epoxy Resin Co., Ltd.), 20 parts by weight of a phenoxy resin (product name "YP50", manufactured by Tohto Kasei Co., Ltd.), 0.5 parts by weight of a cationic photo-hardening initiator (product name "SP170", manufactured by Adeka Corp.), 0.5 parts by weight of a cationic thermo-hardening initiator (product name "SI-150L", manufactured by Sanshin Chemical Industry Co., Ltd.), and 0.1 parts by weight of a surface conditioner (product name "F470", manufactured by DIC Corp.), was dissolved in a solvent of 30 parts by weight toluene and 70 parts by weight methyl ethyl ketone (MEK), and after filtering using a membrane filter with a hole diameter of 1 μm, vacuum degassing was performed to obtain an epoxy resin varnish A.

The epoxy resin varnish A thus obtained was applied using a bar coater onto PET film of thickness 50 μm, and after primary drying for 10 minutes at 80° C., secondary drying for 10 minutes at 120° C. was performed. Finally, as a protective film, an OPP covering film 35 μm thick was applied, to obtain an epoxy film A of film thickness 15 μm. The refractive index of the epoxy film A at 579 nm was 1.54.

2) Epoxy Film B

A blend of 42 parts by weight of a liquid form bis-phenol A epoxy resin (product name "Epichron 850S", manufactured by DIC Corp.), 55 parts by weight of a solid bis-phenol A epoxy resin (product name "Epicoat 1006FS", manufactured by Japan Epoxy Resin Co., Ltd.), 3 parts by weight of a phenoxy resin (product name "YP50", manufactured by Tohto Kasei Co., Ltd.), 1 part by weight of a cationic photo-hardening initiator (product name "SP170", manufactured by Adeka Corp.), and 0.1 part by weight of a surface conditioner (product name "F470", manufactured by DIC Corp.), was dissolved in a solvent of 24 parts by weight toluene and 56 parts by weight MEK, and after filtering using a membrane filter with a hole diameter of 1 μm, vacuum degassing was performed to obtain an epoxy resin varnish B.

The epoxy resin varnish B was formed into a film similarly to the above process, and an epoxy film B of film thickness 40 μl was prepared. The refractive index of the epoxy film B at 579 nm was 1.59. Upon evaluating the optical transmissivity at 850 nm, adequate transparency of 0.06 dB/cm was determined.

3) Epoxy Film C

The epoxy resin varnish A used in preparing the epoxy film A above was employed, and by forming into a film similarly to the process described above, an epoxy film C of film thickness 55 μm was prepared. The refractive index of the epoxy film C at 579 nm was 1.54.

(Fabrication of Multilayer Film for Thermal Transfer)

Next, the multilayer film for thermal transfer, for use in formation of the mirror-reflecting film, was fabricated by the following procedure.

(Multilayer Film 1 for Transfer)

In the method of preparation of the epoxy resin varnish B used in preparing the epoxy film B, in place of the 1 part by weight of the cationic photo-hardening initiator "SP170" (same as above), 1 part by weight of the cationic thermo-hardening initiator "SI-150L" (same as above) was blended; otherwise the same method was used to fabricate the varnish for adhesive layer formation.

The varnish thus obtained was used to form a film similarly to the preparation of the epoxy film B, and upon evaluating the refractive index and transmissivity at 579 nm for the film, values of 1.59 and 0.06 dB/cm respectively were obtained, which were the same as for the epoxy film B.

A polyimide film of thickness 25 μm (product name "Kapton 100H", manufactured by Du Pont-Toray Co., Ltd.) was cut into a square shape measuring 100 mm on a side. On one face, a thin film of Cu was formed by a vacuum sputtering method. The thickness of the thin film thus formed was 1500 Å.

On the Cu side of the two-layer structure film thus obtained, the varnish for adhesive layer formation obtained above was applied using a bar coater, and then primary drying for 10 minutes at 80° C. was performed, followed by secondary drying for 10 minutes at 120° C., to form an epoxy layer (adhesive layer) of thickness 10 μm.

(Multilayer Film 2 for Transfer)

Similarly to the multilayer film 1 for transfer described above, a polyimide film of thickness 25 μm was cut into a square shape measuring 100 mm on a side, and a vacuum sputtering method was used to form a Cu thin film on one face. When forming the Cu thin film by the vacuum sputtering method, a mask with lattice-shape openings was fixed above the polyimide film. The opening portions of the mask were in square shapes 45 μm on a side, and the pitch from opening to opening was 65 μm. The two-layer film obtained had a Cu layer formed into a lattice of square shapes 45 μm on a side. On the Cu side of the two-layer film was formed an adhesive layer, similarly to the multilayer film 1 for transfer.

(Multilayer Film 3 for Transfer)

A multilayer film 3 for transfer was obtained in the same way as the method of fabrication of the multilayer film 1 for transfer described above, except that Al was used in place of Cu as the metal used in vacuum sputtering. The thickness of the film was likewise 1500 Å.

Example 1

As a copper-plated flexible board, a FELIOS board, manufactured by Panasonic Electric Works Co., Ltd. (product name "R-F775", polyimide thickness 25 μm, two-sided board) was made available, and all the Cu on one face was etched off.

As the material for cladding, the epoxy film A was used; the OPP film of the film A was peeled away, the film was placed such that the material was in contact with the etched-off face of the board, and pressure was applied at 60° C. and in 0.2 MPa for 120 seconds to perform lamination. Next, a super-high pressure mercury lamp was used for irradiation with 2000 mJ of light at 365 nm to cause hardening, and finally the PET film was peeled away to form the lower cladding on the board.

Next, the epoxy film B was used as the core material, and similarly to the above procedure, the epoxy film B was placed on the surface of the lower cladding, and lamination was performed by applying pressure at 60° C. and in 0.2 MPa for 120 seconds. Next, a photomask provided with 20 slits of width 40 μm and length 110 mm at intervals of 250 μm was used; this was brought into close contact with the surface of the epoxy film B, and by irradiating to 2000 mJ with ultra-violet rays at 365 nm from a super-high pressure mercury lamp, with the light adjusted to obtain a parallel beam, portions of the transparent epoxy film B corresponding to the slits were hardened with the ultraviolet rays.

Thereafter, a Freon-substitute water-based cleaning agent (product name "Cleanthrough", manufactured by Kao Corp.) was used as a developing liquid in development, to form the core.

Next, micromirror formation was performed. First, dicing was used to form an inclined face at 45°. The blade used was a metal bonded blade with a tip angle of 90°, the abrasive used was #5000, and the blade was lowered from directly above the mirror formation portion at a speed of 0.03 mm/s while maintaining a rotation rate of 15,000 rpm, to cut the core to a position of approximately 5 μm cutting into the lower cladding. The blade was then made to travel in the horizontal direction at a traveling speed of 5 mm/s, and after cutting, the rotating blade was raised in the vertical direction at a speed of 0.03 mm/s. At this time, the face roughness of the cut face was on average 100 nm (rms). Next, thermal transfer was performed to form the reflecting film on the inclined face. As the multilayer film for transfer, multilayer film 1 was used. And, as the head for thermal transfer, a temperature-controlled solder iron was used.

The multilayer film 1 was held with tweezers and, while observing with a microscope, was positioned such that the adhesive side of the multilayer film 1 was in contact with the inclined face at 45° obtained by dicing. Then, the soldering iron with tip temperature adjusted to 170° C. was brought into contact for five seconds from the base side of the multilayer film 1 to cause hardening of the adhesive layer. Then, when the multilayer film 1 was peeled and removed, only the polyimide film was peeled from the 45° inclined face, and it was confirmed that the Cu, together with the adhesive layer, was bonded to the inclined face.

Upon measuring the surface roughness of the transferred face at this time, an RMS value of 80 nm was obtained.

Next, the upper cladding was formed. Similarly to the formation of the lower cladding described above, the epoxy film C was placed onto the core from above, and after laminating by applying pressure of 0.2 MPa for 120 seconds at 80° C., irradiation to 2000 mJ (at 365 nm) with light from a super-high pressure mercury lamp was performed to cause hardening, and finally by peeling the PET film, the upper cladding was formed.

Finally, electrical circuit formation was performed by etching the Cu layer on the surface, to complete the flexible-type optical wiring board.

For the optical wiring board obtained in this way, by causing light of wavelength 850 nm to enter from a mirror on one side and receiving the light emitted from an another mirror by using a photodiode (PD), losses from one mirror to the other mirror were evaluated, and as the result, the average value for 20 lights was 5.2 [dB].

Example 2

Methods similar to those of Example 1 were used, up to formation of the 45° inclined faces.

Next, reflecting film formation by thermal transfer was performed. As the multilayer film for transfer, the multilayer film 3 was used, and as the head for thermal transfer, a temperature-controlled type soldering iron similar to that of Example 1 was used.

The multilayer film 3 was held with tweezers, and while using a microscope for observation, was positioned such that the side of the adhesive layer of the multilayer film 3 was in contact with the 45° inclined face obtained by dicing. The soldering iron with the tip temperature adjusted so as to be 170° C. was brought into contact for 5 seconds with the base face side of the multilayer film 3 to cause hardening of the adhesive layer. Then, upon peeling and removing the multilayer film 3, only the polyimide film was peeled from the 45° inclined face, and it was confirmed that Al was transferred and bonded to the inclined face.

Upon measuring the surface roughness of the transferred face at this time, an RMS value of 82 nm was obtained.

Then, the electrical circuit was formed similarly to Example 1, to complete the flexible-type optical wiring board.

Light of wavelength 850 nm was entered from a mirror on one side of the optical wiring board obtained in this way, and upon using a PD to receive the light emitted from another mirror, and evaluating losses from one mirror to the other mirror, the average value for 20 lights was 7.8 [dB]. Judging from this value, optical losses are worsened compared with Example 1; this is attributed to the fact that the reflectivity at 850 nm of Al, which was used as the metal layer, is poorer than that for Cu (absorption by the metal is larger).

Example 3

Similarly to Example 1, fabrication up to formation of the 45° inclined faces was performed.

Next, reflecting film formation by thermal transfer was performed. As the multilayer film for transfer, the multilayer film 1 was used. As the soldering iron for thermal transfer, the same temperature-controlled type soldering iron as in Example 1 was used; silicone rubber of thickness 15 μm was mounted so as to cover the tip of the iron, and a thermocouple was installed.

The multilayer film 1 was held with tweezers, and while using a microscope for observation, was positioned such that the side of the adhesive layer of the multilayer film 1 was in contact with the 45° inclined face obtained by dicing. The soldering iron, in which a tip temperature was adjusted such that the thermocouple readout was 170° C. (the silicone rubber surface was at 170° C.), was brought into contact for 5 seconds with the base face side to cause hardening of the adhesive layer. Then, upon peeling and removing the multilayer film 1, only the polyimide film was peeled from the 45° inclined face, and it was confirmed that Cu was transferred and bonded to the inclined face.

Upon measuring the surface roughness of the transferred face at this time, an RMS value of 70 nm was obtained.

Then, the electrical circuit was formed similarly to Example 1, to complete the flexible-type optical wiring board.

Light of wavelength 850 nm was entered from a mirror on one side of the optical wiring board obtained in this way, and upon using a PD to receive the light emitted from another mirror, and evaluating losses from one mirror to the other mirror, the average value for 20 lights was 4.8 [dB]. Judging from this value, optical losses are improved compared with Example 1; this is attributed to the fact that the elastic member was affixed to the tip of the iron, so that the surface roughness of the Cu layer at the time of thermal transfer was improved.

Example 4

Similarly to Example 1, fabrication up to formation of the 45° inclined faces was performed.

Next, reflecting film formation using the multilayer film for thermal transfer was performed. As the multilayer film, the multilayer film 2 described above was used. As the soldering iron for thermal transfer, the same temperature-controlled type soldering iron as in Example 1 was used; silicone rubber of thickness 15 μm was mounted so as to cover the tip of the iron, and a thermocouple was installed.

The multilayer film 2 was held with tweezers, and while using a microscope for observation, was positioned such that the side of the adhesive layer of the multilayer film 2 was in contact with the 45° inclined face obtained by dicing. The soldering iron, in which a tip temperature adjusted such that the thermocouple readout was 170° C. (the silicone rubber surface was at 170° C.), was brought into contact for 5 seconds with the base face side of the multilayer film 2 to cause hardening of the adhesive layer. Then, upon peeling and removing the multilayer film, only the polyimide film which was the base layer was peeled from the 45° inclined face, and it was confirmed that Cu was bonded to the inclined face. In this Example, due to the advantageous effect of the divided portions provided in the metal layer, film peeling and removal were performed more easily than in Example 3.

Upon measuring the surface roughness of the transferred face at this time, an RMS value of 63 nm was obtained.

Then, the electrical circuit was formed similarly to Example 1, to complete the flexible-type optical wiring board.

Light of wavelength 850 nm was entered from a mirror on one side of the optical wiring board obtained in this way, and upon using a PD to receive the light emitted from another mirror, and evaluating losses from one mirror to the other mirror, the average value for 20 lights was 4.5 [dB]. Judging from this value, optical losses are improved compared with Example 1; this is attributed to the fact that the metal layer of the multilayer film was divided in advance, so that surface roughness at the time of transfer was improved.

Comparative Example 1

Similarly to Example 1, fabrication up to formation of the 45° inclined faces was performed.

Next, a vacuum sputtering method was used to form a Cu reflecting film. A mask with openings only at positions corresponding to 45° inclined faces was used, and the Cu film formation was adjusted so that Cu adhered to only the desired places. The Cu thickness was 1500 Å.

Then, the electrical circuit was formed similarly to Example 1, to complete the flexible-type optical wiring board.

Light of wavelength 850 nm was entered from a mirror on one side of the optical wiring board obtained in this way, and upon using a PD to receive the light emitted from another mirror, and evaluating losses from one mirror to the other mirror, the average value for 20 lights was 5.9 [dB].

Comparative Example 2

Similarly to Example 1, fabrication up to formation of the 45° inclined faces was performed.

In order to improve the smoothness of the 45° inclined faces obtained, a TEA-$CO_2$ laser (wavelength 9.8 μm) was used in irradiation to the inclined faces from the normal direction, at an energy density of 9 mJ/$mm^2$, over irradiated areas 100 μm on a side, in four irradiation pulses with pulse widths of 9.3 μs repeated at a frequency of 100 Hz. The average (rms) surface roughness of the cut faces at this time was 60 nm, which was an improvement compared with the result of dicing alone.

Then, a Cu reflecting film was formed by a vacuum sputtering method similarly to Comparative Example 1, and thereafter, the electrical circuit was formed similarly to Example 1, to complete the flexible-type optical wiring board.

Light of wavelength 850 nm was entered from a mirror on one side of the optical wiring board obtained in this way, and upon using a PD to receive the light emitted from another mirror, and evaluating losses from one mirror to the other mirror, the average value for 20 lights was 4.4 [dB], which shows that optical losses were lower than for Comparative Example 1.

As described above, one aspect of the present invention is directed to a method of forming a mirror-reflecting film on a waveguide in an optical wiring board, the method being characterized in that a multilayer film, in which a base, a metal layer and an adhesive layer are layered in this order, is used, and in that the metal layer is transferred and bonded to an inclined face for mirror-reflecting film formation provided on the waveguide, with the adhesive layer of the multilayer film intervening.

According to this method, when forming the mirror-reflecting film on the waveguide in the optical wiring board, the mirror-reflecting film can be formed easily and inexpensively using the smallest quantity of metal possible and employing comparatively simple facilities and techniques.

When executing the above method, by hardening the adhesive layer, the metal layer can be transferred and bonded to the inclined face for mirror-reflecting film formation. In the method, a thermosetting adhesive layer is preferably used as the adhesive layer.

The preferred method of transferring and bonding the metal layer of the multilayer film to the inclined face comprises pressing the adhesive layer side of the multilayer film against the inclined face for mirror-reflecting film formation, and applying pressure and/or heat from the base side of the multilayer film using a head with an elastic tip.

In the method, as the metal layer, at least one kind of metal selected from the group consisting of copper, silver, and gold is preferably used.

It is another preferred embodiment in the method to use the multilayer film in which the metal layer is divided into a prescribed shape according to a shape of the inclined face for mirror-reflecting film formation.

As the adhesive layer in the method, it is desirable to use a material which transmits light of wavelength 850 nm.

It is also a preferred embodiment to use, as the adhesive layer, material which has substantially the same refractive index as a core layer of the waveguide.

Further, an optical wiring board comprising the mirror-reflecting film fabricated by the method described above is also included within the technical scope of the present invention.

INDUSTRIAL APPLICABILITY

According to the present invention, when forming a mirror-reflecting film on a waveguide in an optical wiring board, the mirror-reflecting film can be formed easily and inexpensively using the smallest quantity of metal possible and employing comparatively simple facilities and techniques.

The invention claimed is:

1. A method for forming a mirror-reflecting film on a waveguide in an optical wiring board, the method comprising:
   providing a waveguide with an inclined face
   providing a multilayer film, the multilayer film comprising a base layer, a metal layer and an adhesive layer that are layered in this order, and
   transferring and bonding, after the providing of the waveguide and of the multilayer film, the metal layer to the inclined face for mirror-reflecting film formation provided on the waveguide, with the adhesive layer of the multilayer film intervening between the metal layer and the inclined face,
   the base layer having a uniform thickness.

2. The method for forming a mirror-reflecting film according to claim 1, wherein the transferring and bonding of the metal layer to the inclined face for mirror-reflecting film formation comprises hardening of the adhesive layer.

3. The method for forming a mirror-reflecting film according to claim 1, wherein a thermosetting adhesive layer is used as the adhesive layer.

4. The method for forming a mirror-reflecting film according to claim 1, wherein the transferring and bonding of the metal layer to the inclined face comprises pressing the adhesive layer side of the multilayer film against the inclined face for mirror-reflecting film formation, and applying pressure and/or heat from the base layer side of the multilayer film using a head, wherein a tip of the head comprises an elastic member.

5. The method for forming a mirror-reflecting film according to claim 1, wherein the metal layer comprises at least one of copper, silver, and gold.

6. The method for forming a mirror-reflecting film according to claim 1, further comprising dividing the metal layer of the multilayer film into a prescribed shape according to a shape of the inclined face for mirror-reflecting film formation.

7. The method for forming a mirror-reflecting film according to claim 1, wherein a material which transmits light of wavelength 850 nm is used as the adhesive layer.

8. The method for forming a mirror-reflecting film according to claim 1, wherein a material with substantially the same refractive index as a core layer of the waveguide is used as the adhesive layer.

9. An optical wiring board, comprising the mirror-reflecting film fabricated by the method according to claim 1.

10. The method for forming a mirror reflecting film on a waveguide according to claim 1, wherein an entire surface of the metal layer is covered by the adhesive layer.

11. The method for forming a mirror reflecting film on a waveguide according to claim 1, wherein the metal layer covers an entire surface of the inclined face.

12. The method for forming a mirror reflecting film on a waveguide according to claim 1, wherein the inclined face is uniformly covered by the metal and adhesive layers.

13. The method for forming a mirror reflecting film on a waveguide according to claim 1, further comprising peeling the base layer away from the metal layer bonded to the inclined face.

14. The method for forming a mirror-reflecting film on a waveguide according to claim 1, wherein the provided multilayer film, comprising the base layer, the metal layer and the adhesive layer are positioned on the inclined face.

* * * * *